US010180627B2

(12) United States Patent
Wang et al.

(10) Patent No.: US 10,180,627 B2
(45) Date of Patent: *Jan. 15, 2019

(54) PROCESSES FOR PHOTOLITHOGRAPHY

(75) Inventors: Deyan Wang, Hudson, MA (US); George G. Barclay, Jefferson, MA (US); Thomas A. Estelle, Northborough, MA (US); Kenneth J. Spizuoco, Framingham, MA (US); Doris Kang, Shrewsbury, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/795,997

(22) Filed: Jun. 8, 2010

(65) Prior Publication Data

US 2011/0003257 A1    Jan. 6, 2011

Related U.S. Application Data

(60) Provisional application No. 61/185,175, filed on Jun. 8, 2009.

(51) Int. Cl.
G03F 7/11 (2006.01)
G03F 7/38 (2006.01)
H01L 21/027 (2006.01)
G03F 7/039 (2006.01)
G03F 7/20 (2006.01)
G03F 7/32 (2006.01)

(52) U.S. Cl.
CPC .............. *G03F 7/38* (2013.01); *G03F 7/0392* (2013.01); *G03F 7/11* (2013.01); *G03F 7/2041* (2013.01); *G03F 7/325* (2013.01); *H01L 21/0274* (2013.01)

(58) Field of Classification Search
CPC ..... G03F 7/11; G03F 7/30; G03F 7/32; G03F 7/40; G03F 7/0392; G03F 7/38; G03F 7/2041
USPC ...... 430/270.1, 271.1, 273.1, 396, 434, 435, 430/322, 325, 329, 330, 311, 331
See application file for complete search history.

(56) References Cited

U.S. PATENT DOCUMENTS

| 7,371,510 | B2* | 5/2008 | Hirayama | G03F 7/11 430/273.1 |
| 7,608,386 | B2* | 10/2009 | Nozaki et al. | 430/271.1 |
| 7,851,140 | B2* | 12/2010 | Tsubaki | G03F 7/0045 430/270.1 |
| 7,968,268 | B2* | 6/2011 | Wang | 430/270.1 |
| 8,149,379 | B2* | 4/2012 | Donders et al. | 355/30 |
| 8,679,727 | B2* | 3/2014 | Terai et al. | 430/273.1 |
| 8,871,421 | B2* | 10/2014 | Kanda | G03F 7/0046 430/270.1 |
| 8,871,428 | B2* | 10/2014 | Wang | G03F 7/0046 430/270.1 |
| 9,046,765 | B2* | 6/2015 | Nakashima | C08F 220/22 |
| 9,245,751 | B2* | 1/2016 | Su | G03F 7/40 |
| 9,256,128 | B2* | 2/2016 | Chang | C08F 220/18 |
| 9,268,219 | B2* | 2/2016 | Miyata | G03F 7/0046 |
| 9,341,945 | B2* | 5/2016 | Lin | H01L 21/0271 |
| 2007/0134593 | A1* | 6/2007 | Hirayama et al. | 430/270.1 |
| 2008/0070167 | A1* | 3/2008 | Takahashi et al. | 430/330 |
| 2008/0193872 | A1* | 8/2008 | Caporale et al. | 430/270.1 |
| 2008/0227025 | A1* | 9/2008 | Kanda | 430/270.1 |
| 2008/0299502 | A1* | 12/2008 | Shin et al. | 430/324 |
| 2008/0318166 | A1 | 12/2008 | Azuma | |
| 2009/0042147 | A1* | 2/2009 | Tsubaki | 430/326 |
| 2009/0117489 | A1* | 5/2009 | Wang et al. | 430/270.1 |
| 2009/0130592 | A1* | 5/2009 | Wang | 430/270.1 |
| 2009/0239176 | A1* | 9/2009 | Kanda | 430/285.1 |
| 2010/0021703 | A1* | 1/2010 | Terai et al. | 428/195.1 |
| 2010/0304290 | A1* | 12/2010 | Wang et al. | 430/270.1 |
| 2011/0065878 | A1* | 3/2011 | Rhodes et al. | 526/243 |
| 2011/0069289 | A1* | 3/2011 | Lafarre et al. | 355/30 |
| 2011/0080567 | A1* | 4/2011 | Hoekerd et al. | 355/30 |
| 2012/0034558 | A1* | 2/2012 | Chang | 430/270.1 |

FOREIGN PATENT DOCUMENTS

| JP | 05-326389 | 12/1993 |
| JP | 2007-002101 A | 1/2007 |

OTHER PUBLICATIONS

Office Action for Counterpart Japanese Application No. 2010-130771, Dispatch Date May 14, 2015 (4 pages).
English Summary of Japanese Publication No. 2009-069484, published Mar. 11, 1997 (1 page).
English language summary of Office Action dated Mar. 3, 2016 of counterpart Korean Application 10-2010-0053984.
English language summary of Office Action dated May 19, 2016 of counterpart Japanese Application 2015-159936.
English language summary of Office Action dated Mar. 13, 2017 of counterpart Japanese Application 2015-155936.

* cited by examiner

*Primary Examiner* — Amanda C Walke
(74) *Attorney, Agent, or Firm* — Mintz Levin Cohn Ferris Glovsky and Popeo, P.C.; Peter F. Corless

(57) ABSTRACT

New lithographic processing methods are provided which are particularly useful in immersion lithography schemes. In one aspect, processes of the invention comprise: applying on a substrate a photoresist composition; exposing the photoresist layer to radiation activating for the photoresist composition; removing a portion but not all of the exposed photoresist layer; and developing the treated photoresist layer to provide a photoresist relief image.

15 Claims, No Drawings

PROCESSES FOR PHOTOLITHOGRAPHY

The present application claims priority of U.S. Provisional Application No. 61/185,175, filed Jun. 8, 2009, the entire contents of which application is incorporated herein by reference.

The present invention relates to lithographic processes that are particularly useful for immersion lithography. In one aspect, processes of the invention comprise: applying on a substrate a photoresist composition; exposing the photoresist layer to radiation activating for the photoresist composition; removing a portion but not all of the exposed photoresist layer; and developing the treated (i.e. partially removed) photoresist layer to provide a photoresist relief image.

Photoresists are photosensitive films used for transfer of an image to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist coated substrate. Following exposure, the photoresist is developed to provide a relief image that permits selective processing of a substrate. See U.S. Patent Application Publications 2006/0246373 and 2006/0246373.

The growth of the semiconductor industry is driven by Moore's law which states that the complexity of an IC device doubles on average every two years. This necessitates the need to lithographically transfer patterns and structures with ever decreasing feature size.

While currently available photoresists are suitable for many applications, current resists also can exhibit significant shortcomings, particularly in high performance applications such as formation of highly resolved sub-quarter micron and even sub-tenth micron features.

We now provide new photoresist processes that are particularly suitable for immersion lithography.

We have surprisingly found that methods of the invention can result in reduced defects following aqueous alkaline development. Such reduced defects can include reduced organic residues in areas bared of photoresist upon development as well as reduced microbridging between images resist lines or other features.

More particularly, in one aspect, methods of the invention may suitably comprise: (a) applying on a substrate a photoresist composition; (b) immersion exposing the photoresist layer to radiation activating for the photoresist composition; (c) treating the exposed photoresist layer to modulate the water contact angle of the photoresist layer; and (d) developing the treated photoresist layer to provide a photoresist relief image.

In another aspect, methods of the invention may suitably comprise: (a) applying on a substrate a photoresist composition; (b) immersion exposing the photoresist layer to radiation activating for the photoresist composition; (c) removing a portion of the exposed photoresist layer; and (d) developing the treated photoresist layer to provide a photoresist relief image.

Preferably, the exposed photoresist layer is treated prior to development whereby comparatively hydrophobic component(s) of the photoresist layer such as may reside at top portions of the resist layer are selectively removed relative to other less hydrophobic components (such as resin with acid-labile groups) of the resist.

Such treatment of the exposed photoresist layer may be suitably performed either before, at substantially the same time as, or after a post-exposure bake step. In many instances, it can be preferred to perform the treatment step after post-exposure bake and prior to development.

Preferred pre-development, post-exposure treatment protocols include treating the exposed photoresist layer with a solvent composition, which may suitably comprise one or more organic or non-organic solvents. In at least certain aspects, it is preferred that the solvent composition comprise a significant portion (e.g. at least 10, 20, 30, 40, 50, 60, 70, 80 or 90 weight percent based on total solvent composition weight) of one or more relatively hydrophobic solvents, or solvents that are substantially non-miscible with a photoresist coating layer. Such non-miscible solvents may include comparatively non-polar organic solvents (e.g. solvents that do not contain an alcohol, carboxy, or cyano moiety), or otherwise are not substantially misible with a photoresist layer such as water. Suitable hydrophobic solvents include e.g. isoamyl ether, hexane, cyclohexane, heptane, octane and their isomers or isomer mixtures, and water. Such hydrophobic solvents suitably may be blended with one or more comparatively less hydrophobic solvents and that are more miscible with a photoresist layer, such as solvents that contain relatively polar solvents (as may be provided by alcohol, carboxy or groups) e.g. ethyl lactate, propylene glycol methyl ether acetate (PGMEA), propylene glycol methyl ether (PGME), dipropylene glycol monomethyl ether, and tetrahydrofurn. PGME, dipropylene glycol monomethyl ether, and tetrahydrofuran are water miscible and may be effectively employed if water is utilized as a substantially non-miscible component of the solvent composition.

Suitable post-exposure, pre-development treatment steps may vary with the particular photoresist and treatment method utilized and can be readily determined empirically. A suitable post-exposure, pre-development treatment step will not remove an amount of the photoresist layer whereby subsequent development of a functional relief image is inhibited (e.g. where an excessive amount of the photoresist layer is removed). A preferred post-exposure, pre-development stripping or removal treatment step will provide enhanced lithographic results relative to the same process and materials where the treatment step is not employed, e.g. where less undesired post-development organic residues remain on substrate surfaces barred of resist by development.

In one preferred embodiment, an exposed and post-exposure baked photoresist layer is contacted (puddle mode) with a room temperature (20° C.) organic solvent composition (preferably containing at least 30 weight percent of a non-polar (or hydrophobic) solvent such as cyclohexane or isomayl ether for about 20 to 60 seconds prior to development with a 0.26 N tetramethyl ammonium hydroxide developer. A dynamic application (resist-coated wafer being spun) of such a solvent composition for about five seconds or more also may be suitable.

Preferred photoresists for use in methods of the invention may comprise one or more resins, a photoactive component, and one or more materials that are substantially non-mixable with the one or more resins. Such photoresists are disclosed in U.S. Patent Publication 2006/0246373. Particularly preferred photoresists for use in methods of the invention may comprise one or more resins; photoactive component; and one or more materials that comprise 1) Si substitution; 2)

fluorine substitution; 3) hyperbranched polymers; and/or 4) polymeric particles. Such photoresists are also disclosed in U.S. Patent Publication 2006/0246373.

In such photoresists, as referred to herein, one or more materials that are substantially non-mixable with the one or more photoresist resins can be any material added to a photoresist that results in reduced defects upon aqeuous alkaline development. Suitable substantially non-mixable materials for use in photoresists of the invention include compositions that comprise silicon and/or fluorine substitution.

Preferred one or more materials for use in photoresists of methods of the invention comprise acidic groups such as carboxy, fluorinated alcohols (e.g. $(CF_3)_2C(OH)$—), sulfonamide, and/or hetero-substituted carbocyclic aryl moieties.

Also preferred are those substantially non-mixable materials that contain photoacid-labile groups, such as photoacid-labile ester or acetal groups, including such groups as described herein employed in a resin component of a chemically amplified photoresist.

Preferred substantially non-mixable materials for use in photoresists of methods of the invention also will be soluble in the same organic solvent(s) used to formulate the photoresist composition.

Particularly preferred substantially non-mixable materials for use in photoresists of methods of the invention also will have lower surface energy and/or smaller hydrodynamic volume than the one or more resins of the photoresist's resin component. The lower surface energy can facilitate segregation or migration of the substantially non-mixable materials to top or upper portions of an applied the photoresist coating layer. Additionally, relative smaller higher hydrodynamic volume also can be preferred because it can facilitate efficient migration (higher diffusion coefficient) of the one or more substantially non-mixable materials to upper regions of the applied photoresist coating layer.

Preferred substantially non-mixable materials for use in photoresists of the invention also will be soluble in photoresist developer compositions (e.g. 0.26N aqueous alkaline solution). Thus, in addition to photoacid-labile groups as discussed above, other aqueous base-solubilizing groups may be included in the substantially non-mixable materials such as hydroxyl, fluoroalcohol (e.g. —CH(CF$_3$)$_2$), carboxy and the like.

Suitable substantially non-mixable materials for use in photoresists of methods the invention also may be in the form of particles. Such particles may include polymers that are polymerized in the form discrete particles, i.e. as separate and distinct polymer particles. Such polymer particles typically have one or more different characteristics from linear or ladder polymers such as linear or ladder silicon polymers. For example, such polymer particles may have a defined size and a low molecular weight distribution. More particularly, in a preferred aspect, a plurality of the polymer particles may be employed in a photoresist of the invention with a mean particle size (dimension) of from about 5 to 3000 angstroms, more preferably from about 5 to 2000 angstroms, still more preferably from about 5 to about 1000 angstroms, yet more preferably from about 10 to about 500 angstroms, even more preferably from 10 to 50 or 200 angstroms. For many applications, particularly preferred particles have a mean particle size of less than about 200 or 100 angstroms.

Additional suitable substantially non-mixable materials for use in photoresists of methods of the invention may have Si content, including silsesquioxane materials, materials with SiO$_2$ groups, and the like. Preferred silicon-containing substantially non-mixable materials also include polyhedral oligomeric silsesquioxanxes.

Preferred materials include the following:

Branched Photoacid-Labile Groups:

As discussed above, in certain aspects, photoacid-labile groups of the one or more materials may be more highly branched than the photoacid-labile groups of the one or more resins. Suitable highly branched photoacid-labile ester groups for use in the one or more materials in this aspect are disclosed in U.S. Pat. No. 6,136,501. For instance, suitable branched photoacid-labile ester groups may comprise an optionally substituted alkyl moiety having about 5 or more carbon atoms, with at least two branched carbon atoms, i.e. at least two secondary, tertiary or quaternary carbon atoms. The alkyl moiety can be a noncyclic or single ring alicyclic group. Suitable alkyl moieties include those that have one, two or more tertiary carbon atoms, and/or one, two or more quaternary carbons. References herein to a "secondary" carbon indicate the carbon atom has two non-hydrogen substituents (i.e. $\underline{C}H_2RR^1R^2$ where R, R$^1$ and R$^2$ are the same or different and each is other than hydrogen); references herein to a "tertiary" carbon indicate the carbon atom has three non-hydrogen substituents (i.e. $\underline{C}HRR^1R^2$ where R, R$^1$ and R$^2$ are the same or different and each is other than hydrogen); and references herein to a "quaternary" carbon indicate the carbon atom has four non-hydrogen substituents (i.e. $\underline{C}RR^1R^2R^3$ where R, R$^1$, R$^2$ and R$^3$ are each the same or different and each is other than hydrogen). See, for instance, Morrison and Boyd, Organic Chemistry, particularly at page 85 (3$^{rd}$ ed., Allyn and Bacon), for a discussion of those terms secondary, tertiary and quaternary. It also should be understood that references herein to "alkyl" are inclusive of linked or branched carbon chains such as alkylidene, alkylene and the like. Additionally, for purposes of the present disclosure, the keto carbon (i.e. C=$\underline{O}$) of the ester linkage is referred to herein as the "carbonyl oxygen", and the linked oxygen (i.e. C=O($\underline{O}$)) is referred to herein as the "carboxyl oxygen". It is often preferred that a quaternary carbon is directly linked (i.e. covalently linked with no other interposed atoms) to the ester carboxyl oxygen, as is depicted in the above structure.

Acidic Groups:

As discussed above, preferred one or more materials for use in of the invention comprise acidic groups such as carboxy, fluorinated alcohols (e.g. $(CF_3)_2C(OH)$—), sulfonamide, and/or hetero-substituted carbocyclic aryl moieties. Those acidic groups are further discussed as follows.

Carboxy Groups

Such groups include moieties with functionalities of —COOH, such as C$_{1-25}$alkyl substituted with one or more —COOH groups.

Sulfonamide Groups

Preferred photoresist compositions may comprise one or more material that comprise optionally substituted sulfonamide groups, including groups such as RS(=O)(X)NR'$_2$ where R is a non-hydrogen substituent, particularly —OH (to provide —SO$_3$H), optionally substituted C$_{1-20}$alkyl, and an electron-withdrawing group such as halogen especially fluoro or haloalkyl such as fluoralkyl e.g. F$_3$C—. In the formula RS(=O)(X)NR'$_2$, X is a spacer (e.g. a chemical bond or a 1 to 8 carbon linkage), and each R' is independently a hydrogen or non-hydrogen substituent such as optionally substituted C$_{1-20}$alkyl including a group as defined for R above.

It thus should be understood that references herein to "sulfonamide" are inclusive of where a sulfono (SO$_2$) moiety is directly linked (e.g. X in formula RS(=O)(X)NR'$_2$ is chemical bond) to nitrogen as well as where a sulfono (SO$_2$) moiety is spaced by 1, 2, 3 or more atoms (such as carbon atoms, e.g. X in formula RS(=O)(X)NR'$_2$ is (—CH$_2$—)$_{1-3}$) from the nitrogen of the sulfonamide group.

In certain aspects of the invention, preferred are photoresist compositions that comprise materials that comprise sulfonamide group(s) where a sulfono (SO$_2$) moiety is spaced by 1, 2, 3 or more non-nitrogen atoms from the most adjacent nitrogen of the sulfonamide moiety.

Hetero-Substituted Carbocyclic Aryl

Preferred substituted carbocyclic aryl units for incorporation into a resin are naphthyl groups as well as other substituted carbocyclic aryl moieties such as hetero-substituted phenyl, anthracenyl, acenaphthyl, phenanthryl, and the like. Generally, hetero-substituted carbocyclic aryl groups having multiple fused rings (e.g. 2 or 3 fused rings, at least one of which is a carbocyclic aryl) are preferred such as hetero-substituted naphthyl, anthracenyl, acenaphthyl, phenanthryl, and the like.

A carbocyclic group may have a variety of hetero-substituents, with oxygen- and sulfur-containing substituents being generally preferred. For instance, preferred hetero-substituted carbocyclic aryl groups of resins of the invention include those aryl groups having one or more hydroxy (—OH), thio (—SH), alcohol (e.g. hydroxyC$_{1-6}$alkyl), thioalkyl (e.g. HSC$_{1-6}$alkyl), alkanoyl (e.g. C$_{1-6}$alkanoyl such as formyl or acyl), alkylsulfide such as C$_{1-6}$alkylsulfide, carboxylate (including C$_{1-12}$ester), alkyl ether including C$_{1-8}$ether, and the like. Preferably, at least one hetero atom of the hetero-containing substituent has a hydrogen substituent (e.g. hydroxy is preferred over alkoxy). It is also preferred that the hetero group has the hetero atom directly linked to the carbocyclic ring (such as a hydroxy or thio ring substituents), or a hetero atom is a substituent of an activated carbon such as a ring substituent of —CH$_2$OH or —CH$_2$SH, or other primary hydroxy or thio alkyl.

Preferred materials having hetero-substituted carbocyclic aryl units (which can be substantially non-mixable materials) for use in photoresists of the invention also may comprise repeat units in addition to substituted carbocyclic aryl units, particularly non-aromatic units such as provided by polymerization of an acrylate or an optionally substituted cyclic olefin (particularly carbon alicyclic or heteroalicyclic group) such as a polymerized optionally substituted norbornene. Preferably, at least one of the resin repeat units contains a photoacid-labile moiety such as a photoacid-labile ester or acetal moiety. For use in a photoresist imaged at 193 nm, particularly preferred substantially non-mixable resins are substantially free of any aromatic moieties other than the hydroxy naphthyl groups or other hetero-substituted carbocyclic aryl groups.

Additional preferred polymer units may be provided by polymerization of an anhydride such as maleic anhydride or itaconic anhydride; or lactones such as provided by polymerization of a suitable acrylate e.g. acryloxy-norbornane-butyrolactone and the like.

A material having hetero-substituted carbocyclic aryl units (which can be substantially non-mixable materials) for use in photoresists of the invention may suitably contain a relatively wide range of amounts of hydroxy naphthyl units or other hetero-substituted carbocyclic aryl groups. Good lithographic results can be realized with use of a resin that contains quite minor amounts of the hydroxy naphthyl units. For example, a resin (which can be a substantially non-mixable material) for use in photoresists of the invention may suitably contain less than about 50 or 40 mole percent of hetero-substituted carbocyclic aryl units based on total units of a resin, or even less than about 30, 20, 15 or 10 mole percent of hetero-substituted carbocyclic aryl units based on total units of the polymer. Indeed, a substantially non-mixable resin may suitably contain about 0.5, 1, 2, 3, 4, 5, 6, 7 or 8 mole percent of hydroxy naphthyl units based on total units of the resin. Typically, a resin will contain at least about 1, 2, 3, 4 or 5 mole percent of hetero-substituted carbocyclic aryl units such as hydroxy naphthyl units based on total resin units. Generally preferred are resins that contain at least or up to about 5, 10, 20, 30, 40, or 45 hetero-substituted carbocyclic aryl units such as hydroxy naphthyl units based on total resin units.

Preferred materials having hetero-substituted carbocyclic aryl units (which can be substantially non-mixable materials) for use in photoresists of the invention imaged at 193 nm and suitably will be substantially free of any phenyl or other aromatic groups other than the hetero-substituted carbocyclic aryl units. For example, preferred polymers contain less than about 5 mole percent aromatic groups other than the hetero-substituted carbocyclic aryl units, more preferably less than about 1 or 2 mole percent aromatic groups hetero-substituted carbocyclic aryl units.

As discussed, various moieties of hetero-substituted carbocylic aryl materials, resin units and other components of photoresists of the invention may be optionally substituted. A "substituted" substituent may be substituted at one or more available positions, typically 1, 2, or 3 positions by one or more suitable groups such as e.g. halogen (particularly F, Cl or Br); cyano; C$_{1-8}$ alkyl; C$_{1-8}$ alkoxy; C$_{1-8}$ alkylthio; C$_{1-8}$ alkylsulfonyl; C$_{2-8}$ alkenyl; C$_{2-8}$ alkynyl; hydroxyl; nitro; alkanoyl such as a C$_{1-6}$ alkanoyl e.g. acyl and the like; etc.

Preferred substituted carbocyclic aryl units for incorporation into a resin are naphthyl groups substituted with one or more hydroxy (—OH), thio (—SH), alcohol (e.g. hydroxyC$_{1-6}$alkyl), thioalkyl (e.g. HSC$_{1-6}$alkyl), alkanoyl (e.g. C$_{1-6}$alkanoyl such as formyl or acyl), alkylsulfide such as C$_{1-6}$alkylsulfide, carboxylate (including C$_{1-12}$ester), alkyl ether including C$_{1-8}$ether, and the like. Preferably, at least one hetero atom of the hetero-containing substituent has a hydrogen substituent (e.g. hydroxy is preferred over alkoxy). It is also preferred that the hetero group has the hetero atom directly linked to the carbocyclic ring (such as a hydroxy or thio ring substituents), or a hetero atom is a substituent of an activated carbon such as a ring substituent of —CH$_2$OH or —CH$_2$SH, or other primary hydroxy or thio alkyl.

Fluorinated Alcohols

A wide range of fluorinated alcohol groups may be employed including C$_{1-25}$alkyl substituted with one or more fluorine atoms. A particularly preferred fluoroalcohol group is (CF$_3$)$_2$C(OH)—.

Preferred imaging wavelengths of lithographic systems of the invention include sub-300 nm wavelengths e.g. 248 nm, and sub-200 nm wavelengths e.g. 193 nm. In addition to one or more substantially non-mixable materials, particularly preferred photoresists of the invention may contain a photoactive component (e.g. one or more photoacid generator compounds) and one or more resins that are chosen from among:

1) a phenolic resin that contains acid-labile groups that can provide a chemically amplified positive resist particularly suitable for imaging at 248 nm. Particularly preferred resins of this class include: i) polymers that contain polymerized units of a vinyl phenol and an alkyl acrylate, where the polymerized alkyl acrylate units can undergo a deblocking reaction in the presence of photoacid. Exemplary alkyl acrylates that can undergo a photoacid-induced deblocking reaction include e.g. t-butyl acrylate, t-butyl methacrylate, methyladamantyl acrylate, methyl adamantyl methacrylate, and other non-cyclic alkyl and alicyclic acrylates that can undergo a photoacid-induced reaction, such as polymers in U.S. Pat. Nos. 6,042,997 and 5,492,793, incorporated herein by reference; ii) polymers that contain polymerized units of a vinyl phenol, an optionally substituted vinyl phenyl (e.g. styrene) that does not contain a hydroxy or carboxy ring substituent, and an alkyl acrylate such as those deblocking groups described with polymers i) above, such as polymers described in U.S. Pat. No. 6,042,997, incorporated herein by reference; and iii) polymers that contain repeat units that comprise an acetal or ketal moiety that will react with photoacid, and optionally aromatic repeat units such as phenyl or phenolic groups; such polymers have been described in U.S. Pat. Nos. 5,929,176 and 6,090,526, incorporated herein by reference, as well as blends of i) and/or ii) and/or iii);

2) phenolic resins that do not contain acid-labile groups such as poly(vinylphenol) and novolak resins that may be employed in I-line and G-line photoresists together with a diazonaphthoquinone photoactive compound and have been described e.g. in U.S. Pat. Nos. 4,983,492; 5,130,410; 5,216,111; and 5529880;

3) a resin that is substantially or completely free of phenyl or other aromatic groups that can provide a chemically amplified positive resist particularly suitable for imaging at sub-200 nm wavelengths such as 193 nm. Particularly preferred resins of this class include: i) polymers that contain polymerized units of a non-aromatic cyclic olefin (endocyclic double bond) such as an optionally substituted norbornene, such as polymers described in U.S. Pat. Nos. 5,843,624, and 6,048,664, incorporated herein by reference; ii) polymers that contain alkyl acrylate units such as e.g. t-butyl acrylate, t-butyl methacrylate, methyladamantyl acrylate, methyl adamantyl methacrylate, and other non-cyclic alkyl and alicyclic acrylates; such polymers have been described in U.S. Pat. No. 6,057,083; European Published Applications EP01008913A1 and EP00930542A1; and U.S. pending patent application Ser. No. 09/143,462, all incorporated herein by reference, and iii) polymers that contain polymerized anhydride units, particularly polymerized maleic anhydride and/or itaconic anhydride units, such as disclosed in European Published Application EP01008913A1 and U.S. Pat. No. 6,048,662, both incorporated herein by reference, as well as blends of i) and/or ii) and/or iii);

4) a resin that contains repeat units that contain a hetero atom, particularly oxygen and/or sulfur (but other than an anhydride, i.e. the unit does not contain a keto ring atom), and preferable are substantially or completely free of any aromatic units. Preferably, the heteroalicyclic unit is fused to the resin backbone, and further preferred is where the resin comprises a fused carbon alicyclic unit such as provided by polymerization of a norborene group and/or an anhydride unit such as provided by polymerization of a maleic anhydride or itaconic anhydride. Such resins are disclosed in PCT/US01/14914 and U.S. application Ser. No. 09/567,634.

5) resins that contain Si-substitution including poly(silsesquioxanes) and the like and may be used with an undercoated layer. Such resins are disclosed e.g. in U.S. Pat. No. 6,803,171.

6) a resin that contains fluorine substitution (fluoropolymer), e.g. as may be provided by polymerization of tetrafluoroethylene, a fluorinated aromatic group such as fluorostyrene compound, compounds that comprise a hexafluoroalcohol moiety, and the like. Examples of such resins are disclosed e.g. in PCT/US99/21912.

Preferred photoresists for use in the invention include both chemically-amplified positive-acting and negative-acting photoresists. Typically preferred chemically-amplified positive resists include one or more resins that comprise photoacid-labile groups such as photoacid-labile ester or acetal groups.

The invention further provides methods for forming photoresist relief images and producing an electronic device using photoresists of the invention. The invention also provides novel articles of manufacture comprising substrates coated with photoresists as disclosed herein.

Other aspects of the invention are disclosed infra.

As discussed above, methods of the invention can provide photoresist relief images with reduced defects following aqueous alkaline development. Such reduced defects can include reduced organic residues in areas bared of photoresist upon development.

More particularly, in one aspect, methods of the invention may suitably comprise: (a) applying on a substrate a photoresist composition; (b) immersion exposing the photoresist layer to radiation activating for the photoresist composition; (c) modulating the water contact angle of the exposed photoresist layer; and thereafter (d) developing the photoresist layer to provide a photoresist relief image. Exposure is preferably by an immersion lithography process. The water contact angle of the photoresist layer is suitably decreased by treatment with a fluid composition that does not remove the functional thickness of the photoresist layer (i.e. a sufficiently thick photoresist layer remains after such fluid composition treatment to enable formation of a good quality resist relief image upon subsequent aqueous alkaline development).

In another aspect, preferred methods of the invention may suitably comprise: (a) applying on a substrate a photoresist composition; (b) exposing the photoresist layer to radiation activating for the photoresist composition; (c) removing a portion of the exposed photoresist layer; and (d) developing the treated photoresist layer to provide a photoresist relief image. Exposure is preferably by an immersion lithography process. The post-exposure, pre-development treating step suitably includes treatment with a fluid composition that does not remove the functional thickness of the photoresist layer (i.e. a sufficiently thick photoresist layer remains after such fluid composition treatment to enable formation of a good quality resist relief image upon subsequent aqueous alkaline development).

As discussed, in such methods of the invention a suitable post-exposure, pre-development treatment step will not remove an amount of the photoresist layer whereby subsequent development of a functional relief image is inhibited (e.g. where an excessive amount of the photoresist layer is removed). For instance, preferred suitable post-exposure, pre-development treatment steps will not remove more than about 10, 20, 30, 40, 50, 60, 70 or 80 percent of the exposed photoresist layer thickness.

As discussed above, suitable materials of photoresists of the invention that are substantially non-mixable with the resist resin component can be readily identified by simple testing. In particular, as referred to herein, preferred substantially non-mixable materials will provide a decreased occurrence or amount of defects upon aqueous alkaline development relative to a comparable photoresist relative to the same photoresist system that is processed into the same manner, but in the absence of the candidate substantially non-mixable material(s). Assessment of defects (or absence thereof) can be made via scanning electron micrography. Detection of photoresist material in the immersion fluid can be conducted as described in Example 2 of U.S. Patent Publication 2006/0246373 and includes mass spectroscopy analysis of the immersion fluid before and after exposure to the photoresist. In such analysis, the immersion fluid directly contacts the tested photoresist composition layer for about 60 seconds during exposure. Preferably, addition of one or more substantially non-mixable materials provides at least a 10 percent reduction in photoresist material (again, acid or organics as detected by mass spectroscopy) residing in the immersion fluid relative to the same photoresist that does not employ such substantially non-mixable material(s), more preferably the one or more substantially non-mixable materials provides at least a 20, 50, or 100, 200, 500, or 1000 percent reduction photoresist material (again, acid and/or organics) residing in to the immersion fluid relative to the same photoresist that does not contain the substantially non-mixable material(s).

Preferred photoresists of the invention will result in less than $1.6 \times E-10$ (mole/cm$^2$/sec) of photoacid generator material being leached into deionized water or other overcoating immersion fluid for 60 seconds during exposure by the analysis method described in Example 2 of U.S. Patent Publication 2006/0246373.

Preferred photoresists of the invention may have preferred water contact angles. As referred to herein, water contact angles, such as static, receding, advancing sliding, developer static can be determined in accordance with the producers disclosed in Burnett et al., *J. Vac. Sci. Techn. B*, 23(6), pages 2721-2727 (November/December 2005). Preferred photoresists (as determined as a spin-coated layer with solvent removed by soft-bake) will have a receding angle of at least 65°, more preferably at least 70°. Additionally, preferred substantially non-mixable materials (as determined as a spin-coated layer with solvent removed by soft-bake) will have a receding angle of at least 65°, more preferably at least 70°.

Particularly preferred materials (which may be substantially non-mixable with the one or more polymers) include higher order polymers e.g. copolymers, terpolymers, tetrapolymers and pentapolymers. Particularly preferred are such polymers that comprise fluorine substitution. Preferred fluoro substitution include perfluoro groups e.g. F$_3$C—, F$_3$CCF$_2$—, and fluorinated alcohols e.g. (F$_3$C)$_2$C(OH)—. Preferred resin one or more materials may have a wide range of molecular weights including Mw of from 1,000 to 100,000, more typically about 1,000 to about 20,000 or 30,000.

Specifically preferred substantially non-mixable resins for use in photoresists of the invention include the following. Also, the branched ester group moieties depicted below (i.e. —C(CH$_2$CH$_3$)(CH$_3$)$_2$, —C(CH$_2$CH$_3$)$_3$, —C(CH(CH$_3$)$_2$)$_3$, —C(CH$_3$)$_2$CH(CH$_3$)$_2$, etc.) are particularly preferred branched groups

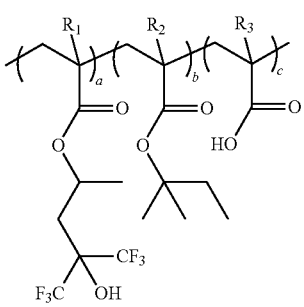

-continued

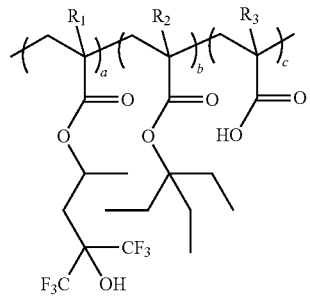

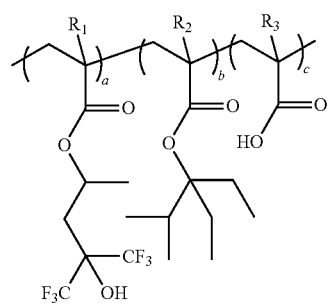

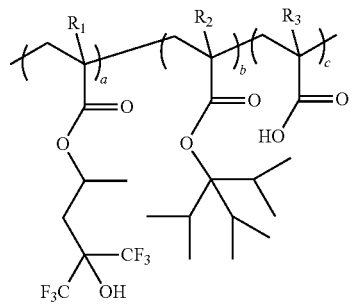

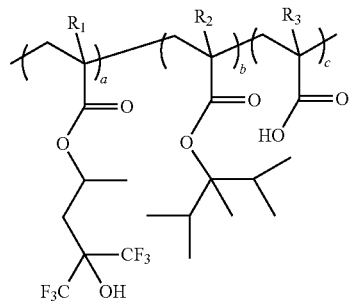

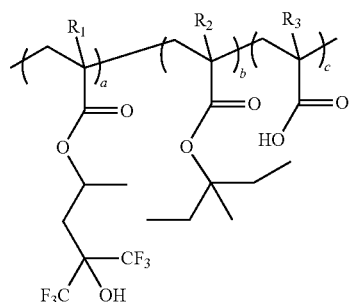

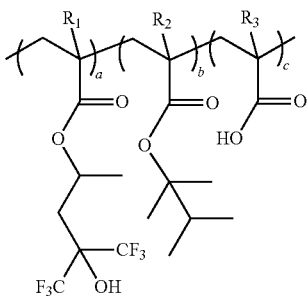

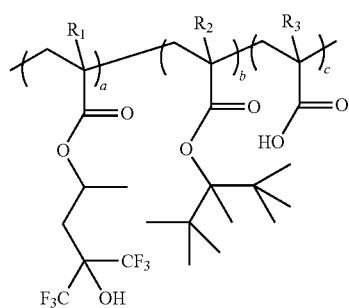

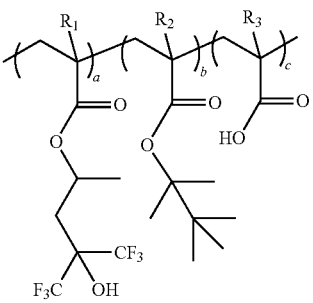

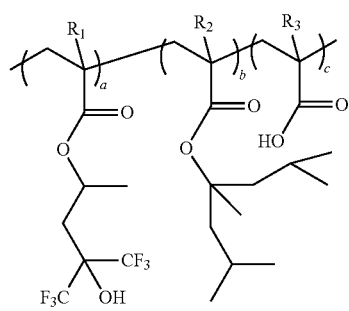

where R1 through R3 in each of the above structures in hydrogen or methyl

Additional specifically preferred substantially non-mixable resins for use in photoresists of the invention include the following (with the below group—(ethyl)cyclopentyl—being another particularly preferred branched group):

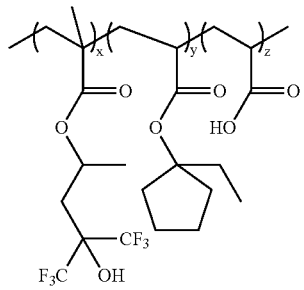

As discussed above, suitable substantially non-mixable materials include Si-containing materials. Especially preferred substantially non-mixable materials include nano-structured compositions, which are commercially available from groups such as Hybrid Plastics (Fountain Valley, Calif.), Sigma/Aldrich, and others. Such materials may include molecular silicas which have a Si—O core enveloped by organic groups; silanols; and polymers and resins which include silsesquioxane cage-structured compounds and may be silicones, styrenics, acrylics, alicyclics such as norbornenes and others.

Particles (including organic particles) useful as substantially non-mixable materials include Si-containing and fluorinated materials that have carboxy substitution. Such particles are commercially available, or can be readily synthesized, e.g. by reaction of one or more monomers together with a crosslinking agent and an initiator compound if desired. The reacted monomers may have substitution as desired e.g. fluorine, Si groups, photoacid-labile groups such as photoacid-labile esters or acetals, other base-solubilizing groups such as alcohols and the like. See Example 1 which follows for an exemplary synthesis of such particles produced with multiple distinct monomers, where one of the monomers provides a photoacid-labile group to the resulting polymer particle.

The substantially non-mixable material(s) may be present in a photoresist composition in relatively small amounts and still provide effective results. For instance, the one or more substantially non-mixable materials may be suitable present in about 0.1 to 20 weight percent based on total weight of a fluid photoresist composition. Suitable amounts also are provided in the examples which follow.

As discussed above, preferred photoresists for use in accordance with the invention include positive-acting or negative-acting chemically amplified photoresists, i.e. negative-acting resist compositions which undergo a photoacid-promoted crosslinking reaction to render exposed regions of a coating layer of the resist less developer soluble than unexposed regions, and positive-acting resist compositions which undergo a photoacid-promoted deprotection reaction of acid labile groups of one or more composition components to render exposed regions of a coating layer of the resist more soluble in an aqueous developer than unexposed regions. Ester groups that contain a tertiary non-cyclic alkyl carbon (e.g. t-butyl) or a tertiary alicyclic carbon (e.g. methyladamantyl) covalently linked to the carboxyl oxygen of the ester are often preferred photoacid-labile groups of resins employed in photoresists of the invention. Acetal photoacid-labile groups also will be preferred.

Preferred photoresists of the invention typically comprise a resin component and a photoactive component. Preferably the resin has functional groups that impart alkaline aqueous developability to the resist composition. For example, preferred are resin binders that comprise polar functional groups such as hydroxyl or carboxylate. Preferably a resin component is used in a resist composition in an amount sufficient to render the resist developable with an aqueous alkaline solution.

For imaging at wavelengths greater than 200 nm, such as 248 nm, phenolic resins are typically preferred. Preferred phenolic resins are poly (vinylphenols) which may be formed by block polymerization, emulsion polymerization or solution polymerization of the corresponding monomers in the presence of a catalyst. Vinylphenols useful for the production of polyvinyl phenol resins may be prepared, for example, by hydrolysis of commercially available coumarin or substituted coumarin, followed by decarboxylation of the resulting hydroxy cinnamic acids. Useful vinylphenols may also be prepared by dehydration of the corresponding hydroxy alkyl phenols or by decarboxylation of hydroxy cinnamic acids resulting from the reaction of substituted or nonsubstituted hydroxybenzaldehydes with malonic acid. Preferred polyvinylphenol resins prepared from such vinylphenols have a molecular weight range of from about 2,000 to about 60,000 daltons.

Also preferred for imaging at wavelengths greater than 200 nm, such as 248 nm are chemically amplified photoresists that comprise in admixture a photoactive component and a resin component that comprises a copolymer containing both phenolic and non-phenolic units. For example, one preferred group of such copolymers has acid labile groups substantially, essentially or completely only on non-phenolic units of the copolymer, particularly alkylacrylate photoacid-labile groups, i.e. a phenolic-alkyl acrylate copolymer. One especially preferred copolymer binder has repeating units x and y of the following formula:

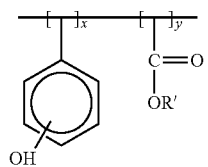

wherein the hydroxyl group be present at either the ortho, meta or para positions throughout the copolymer, and R' is substituted or unsubstituted alkyl having 1 to about 18 carbon atoms, more typically 1 to about 6 to 8 carbon atoms. Tert-butyl is a generally preferred R' group. An R' group may be optionally substituted by e.g. one or more halogen (particularly F, Cl or Br), $C_{1-8}$ alkoxy, $C_{2-8}$ alkenyl, etc. The units x and y may be regularly alternating in the copolymer, or may be randomly interspersed through the polymer. Such copolymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e. moiety of the acrylate units serves as the acid labile groups of the resin and will undergo photoacid induced cleavage upon exposure of a coating layer of a photoresist containing the resin. Preferably the copolymer will have a $M_w$ of from about 8,000 to about 50,000, more preferably about 15,000 to about 30,000 with a molecular weight distribution of about 3 or less, more preferably a molecular weight distribution of about 2 or less. Non-phenolic resins, e.g. a copolymer of an alkyl acrylate such as t-butylacrylate or t-butylmethacrylate and a vinyl alicyclic such as a vinyl norbornanyl or vinyl cyclohexanol compound, also may be used as a resin binder in compositions of the invention. Such copolymers also may be prepared by such free radical polymerization or other known procedures and suitably will have a $M_w$ of from about 8,000 to about 50,000, and a molecular weight distribution of about 3 or less.

Other preferred resins that have acid-labile deblocking groups for use in a positive-acting chemically-amplified photoresist for use in the invention have been disclosed in European Patent Application 0829766A2 of the Shipley Company (resins with acetal and ketal resins) and European Patent Application EP0783136A2 of the Shipley Company (terpolymers and other copolymers including units of 1) styrene; 2) hydroxystyrene; and 3) acid labile groups, particularly alkyl acrylate acid labile groups such as t-butylacrylate or t-butylmethacrylate). In general, resins having a variety of acid labile groups will be suitable, such as acid sensitive esters, carbonates, ethers, imides, etc. The photoacid labile groups will more typically be pendant from a polymer backbone, although resins that have acid labile groups that are integral to the polymer backbone also may be employed.

As discussed above, for imaging at sub-200 nm wavelengths such as 193 nm, preferably a photoresist is employed that contains one or more polymers that are substantially, essentially or completely free of phenyl or other aromatic groups. For example, for sub-200 nm imaging, preferred photoresist polymers contain less than about 5 mole percent aromatic groups, more preferably less than about 1 or 2 mole percent aromatic groups, more preferably less than about 0.1, 0.02, 0.04 and 0.08 mole percent aromatic groups and still more preferably less than about 0.01 mole percent aromatic groups. Particularly preferred polymers are completely free of aromatic groups. Aromatic groups can be highly absorbing of sub-200 nm radiation and thus are undesirable for polymers used in photoresists imaged with such short wavelength radiation.

Suitable polymers that are substantially or completely free of aromatic groups and may be formulated with a PAG of the invention to provide a photoresist for sub-200 nm imaging are disclosed in European application EP930542A1 and U.S. Pat. Nos. 6,692,888 and 6,680,159, all of the Shipley Company.

Suitable polymers that are substantially or completely free of aromatic groups suitably contain acrylate units such as photoacid-labile acrylate units as may be provided by polymerization of methyladamanatylacrylate, methyladamantylmethacrylate, ethylfenchylacrylate, ethylfenchylmethacrylate, and the like; fused non-aromatic alicyclic groups such as may be provided by polymerization of a norbornene compound or other alicyclic compound having an endocyclic carbon-carbon double bond; an anhydride such as may be provided by polymerization of maleic anhydride and/or itaconic anhydride; and the like.

Preferred negative-acting compositions for use in the invention comprise one or more materials (such as a crosslinker component e.g. an amine-based materials such as a melamine resin) that will cure, crosslink or harden upon exposure to acid, and a photoactive component of the invention. Particularly preferred negative acting compositions comprise a resin binder such as a phenolic resin, a crosslinker component and a photoactive component of the invention. Such compositions and the use thereof has been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycolurils, benzoguanamine-based materials and urea-based materials. Melamine-formaldehyde resins are generally most preferred. Such crosslinkers are commercially available, e.g. the melamine resins sold by American Cyanamid under the trade names Cymel 300, 301 and 303. Glycoluril resins are sold by American Cyanamid under trade names Cymel 1170, 1171, 1172, urea-based resins are sold under the trade names of Beetle 60, 65 and 80, and benzoguanamine resins are sold under the trade names Cymel 1123 and 1125.

For imaging at sub-200 nm wavelengths such as 193 nm, preferred negative-acting photoresists are disclosed in WO 03077029 to the Shipley Company.

Photoresists of the invention also may contain other materials. For example, other optional additives include actinic and contrast dyes, anti-striation agents, plasticizers, speed enhancers, sensitizers (e.g. for use of a PAG of the invention at longer wavelengths such as I-line (i.e. 365 nm) or G-line wavelengths), etc. Such optional additives typically will be present in minor concentration in a photoresist composition except for fillers and dyes which may be present in relatively large concentrations such as, e.g., in amounts of from 5 to 30 percent by weight of the total weight of a resist's dry components.

A preferred optional additive of resists for use in the invention is an added base, e.g. a caprolactam, which can enhance resolution of a developed resist relief image. The added base is suitably used in relatively small amounts, e.g. about 1 to 10 percent by weight relative to the PAG, more typically 1 to about 5 weight percent. Other suitable basic additives include ammonium sulfonate salts such as piperidinium p-toluenesulfonate and dicyclohexylammonium p-toluenesulfonate; alkyl amines such as tripropylamine and dodecylamine; aryl amines such as diphenylamine, triphenylamine, aminophenol, 2-(4-aminophenyl)-2-(4-hydroxyphenyl)propane, etc.

The resin component of resists for use in the invention is typically used in an amount sufficient to render an exposed coating layer of the resist developable such as with an aqueous alkaline solution. More particularly, a resin binder will suitably comprise 50 to about 90 weight percent of total solids of the resist. The photoactive component should be present in an amount sufficient to enable generation of a latent image in a coating layer of the resist. More specifically, the photoactive component will suitably be present in an amount of from about 1 to 40 weight percent of total solids of a resist. Typically, lesser amounts of the photoactive component will be suitable for chemically amplified resists.

Photoresists for use in the invention also comprise a photoacid generator (i.e. "PAG") that is suitably employed in an amount sufficient to generate a latent image in a coating layer of the resist upon exposure to activating radiation. Preferred PAGs for imaging at 193 nm and 248 nm imaging include imidosulfonates such as compounds of the following formula:

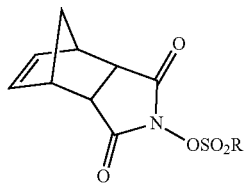

wherein R is camphor, adamantane, alkyl (e.g. $C_{1-12}$ alkyl) and fluoroalkyl such as fluoro($C_{1-18}$alkyl) e.g. $RCF_2$— where R is optionally substituted adamantyl.

Also preferred is a triphenyl sulfonium PAG, complexed with anions such as the sulfonate anions mentioned above, particularly a perfluoroalkyl sulfonate such as perfluorobutane sulfonate.

Other known PAGS also may be employed in the resists of the invention. Particularly for 193 nm imaging, generally preferred are PAGS that do not contain aromatic groups, such as the above-mentioned imidosulfonates, in order to provide enhanced transparency.

Other suitable photoacid generators for use in present photoresists include for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, nitrobenzyl derivatives, for example, 2-nitrobenzyl p-toluenesulfonate, 2,6-dinitrobenzyl p-toluenesulfonate, and 2,4-dinitrobenzyl p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenensulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. One or more of such PAGs can be used.

A preferred optional additive of photoresist used in accordance with the invention is an added base, particularly tetrabutylammonium hydroxide (TBAH), or tetrabutylammonium lactate, which can enhance resolution of a developed resist relief image. For resists imaged at 193 nm, a preferred added base is a lactate salt of tetrabutylammonium hydroxide as well as various other amines such as triisopropanol, diazabicyclo undecene or diazabicyclononene. The added base is suitably used in relatively small amounts, e.g. about 0.03 to 5 percent by weight relative to the total solids.

Photoresists used in accordance with the invention also may contain other optional materials. For example, other optional additives include anti-striation agents, plasticizers, speed enhancers, etc. Such optional additives typically will be present in minor concentrations in a photoresist composition except for fillers and dyes which may be present in relatively large concentrations, e.g., in amounts of from about 5 to 30 percent by weight of the total weight of a resist's dry components.

The photoresists used in accordance with the invention are generally prepared following known procedures. For example, a resist of the invention can be prepared as a coating composition by dissolving the components of the photoresist in a suitable solvent such as, e.g., a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate, with ethyl lactate being preferred; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. Typically the solids content of the photoresist varies between 5 and 35 percent by weight of the total weight of the photoresist composition. Blends of such solvents also are suitable.

Liquid photoresist compositions may be applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

Photoresist compositions used in accordance with the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like are also suitably employed. Photoresists also may be suitably applied over an antireflective layer, particularly an organic antireflective layer.

Following coating of the photoresist onto a surface, it may be dried by heating to remove the solvent until preferably the photoresist coating is tack free.

The photoresist layer (with overcoated barrier composition layer, if present) in then exposed to activating radiation preferably in an immersion lithography system, i.e. where the space between the exposure tool (particularly the projection lens) and the photoresist coated substrate is occupied by an immersion fluid, such as water or water mixed with one or more additives such as cesium sulfate which can provide a fluid of enhanced refractive index. Preferably the immersion fluid (e.g., water) has been treated to avoid bubbles, e.g. water can be degassed to avoid nanobubbles.

References herein to "immersion exposing" or other similar term indicates that exposure is conducted with such a fluid layer (e.g. water or water with additives) interposed between an exposure tool and the coated photoresist composition layer.

The photoresist composition layer is then suitably patterned exposed to activating radiation with the exposure energy typically ranging from about 1 to 100 mJ/cm$^2$, dependent upon the exposure tool and the components of the photoresist composition. References herein to exposing a photoresist composition to radiation that is activating for the photoresist indicates that the radiation is capable of forming a latent image in the photoresist such as by causing a reaction of the photoactive component (e.g. producing photoacid from the photoacid generator compound).

As discussed above, photoresist compositions are preferably photoactivated by a short exposure wavelength, particularly a sub-400 nm, sub-300 and sub-200 nm exposure wavelength, with I-line (365 nm), 248 nm and 193 nm being particularly preferred exposure wavelengths as well as EUV and 157 nm.

Following exposure, the film layer of the composition is preferably baked at temperatures ranging from about 70° C. to about 160° C.

The photoresist layer is then subjected to a partial removal step, wherein a top portion (e.g. up to about 10, 20, 30, 40, 50, 60, 70, 80, 90 or 100 angstroms of the resist layer) is removed and/or the water contact angle of the resist surface is modulated (typically, the water contact angle is reduced). This treatment step is suitably conducted following a post-exposure bake step, but also may be conducted immediately after exposure and prior to a post-exposure thermal treatment.

Thereafter, the thus treated photoresist film is developed, preferably by treatment with an aqueous based developer such as quaternary ammonium hydroxide solutions such as a tetra-alkyl ammonium hydroxide solution; various amine solutions preferably a 0.26 N tetramethylammonium hydroxide, such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a halogen plasma etchant such as a chlorine or fluorine-based etchant such a $Cl_2$ or $CF_4/CHF_3$ etchant applied as a plasma stream. After such processing, resist may be removed from the processed substrate using known stripping procedures.

All documents mentioned herein are incorporated herein by reference. The following non-limiting examples are illustrative of the invention. All documents mentioned herein are incorporated by reference in their entirety.

EXAMPLE 1: CARBOXY RESIN PREPARATION

A carboxy terpolymer resin having the following structure was prepared as described:

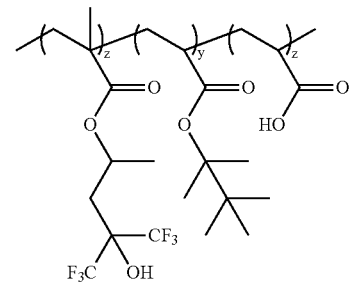

x/y/z = 70/28/2 by weight

A. Monomer and initiator mixture: weigh 7.00 g of $CH_3(CH=CH)C(=O)OCH(CH_3)CH_2C(CF_3)_2OH$ (the first monomer), 2.80 g of $(CH_2=CH)C(=O)OC(CH(CH_3))_2C(CH_3)_3$ (the second monomer) and 2.0 g of acetic anhydride (the third monomer), 0.42 g of Trignox-23 (initiator) and 17.0 g PGMEA (solvent) into a feeding vial.
B. Reactor: 30 g of PGMEA in a reactor and maintain at 85° C.
C. Feed A into B: A is fed into B with a constant feeding rate in 120 minutes.
D. Holding temperature: after feeding A into B, the temperature of the reactor is maintained at 85° C. for additional two hrs, then allow the reactor temp to cool down naturally to room temperature.

The carboxy resin from the reactor can be used in a photoresist composition without further purification.

EXAMPLE 2: ADDITIONAL CARBOXY RESIN PREPARATION

By procedures similar to those of Example 1, the following carboxy resin is prepared:

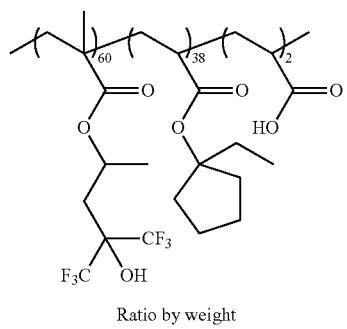

Ratio by weight

EXAMPLE 3: HETERO-SUBSTITUTED CARBOCYCLIC ARYL RESIN PREPARATION

A hydroxy naphthyl terpolymer resin having the following structure was prepared as described below:

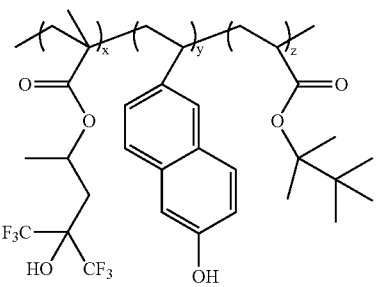

x/y/z = 65/10/25

1. Reactor: Add 20 g of propylene propylene glycol methyl ether acetate (PGMEA) to a 100 ml flask with a magnetic stir bar, and place the flask in a bath at 85° C. with stirring and with reflux condenser. Purge the reactor with dry nitrogen.
2. Monomer/Initiator Solution: Weigh 6.5 g of 4,4,4-trifluoro-3-hydroxy-1-methyl-3-(trifluoromethyl)butyl-2-methacrylate, and 1.0 g of hydroxy vinyl naphthalene, and 2.5 g of 2,3,3-trimethyl acrylate into a suitable vial. Then add to the vial 10.0 g of PGMEA. Shake the vial to dissolve all the monomers, and then place the vial in a ice bath to cool the monomer solution to 0° C. Then add 0.3 g of tert-butyl peroxyneodecanoate (initiator of Triganox 23, from Noury Chemicals) to the monomer vial and shake the vial to dissolve the initiator. Place the monomer/initiator solution in the ice bath.
3. Polymerization: Feed the monomer/initiator solution into the reactor in 90 minutes with a suitable feeding pump while maintaining the monomer/initiator vial in the ice bath. After feeding the monomer/initiator solution, the reactor is kept at 85° C. for additional 3 hours with stirring. The reactor was then allowed to cool to room temp naturally. The concentration of the polymer obtained in the reactor is 23 to 25% in general, Mw: 10,000 to 12,000.

EXAMPLE 4: SULFONAMIDE RESIN PREPARATION

A sulfonamide copolymer resin having the following structure was prepared as described below:

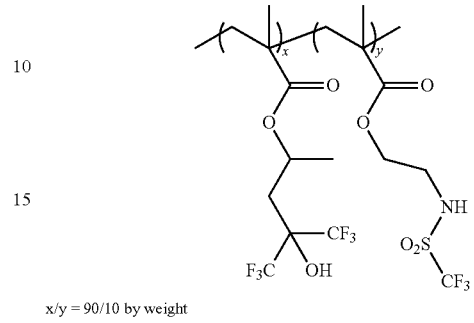

x/y = 90/10 by weight

A. Monomer and initiator mixture: weigh 7.00 g of $CH_3(CH=CH)C(=O)OCH(CH_3)CH_2C(CF_3)_2OH$ (the first monomer), 2.80 g of $(CH_2=CH)C(=O)OC(CH2)_2NHSO_2CF_3$ (the second monomer) 0.42 g of Trignox-23 (initiator) and 17.0 g PGMEA (solvent) into a feeding vial.
B. Reactor: 30 g of PGMEA in a reactor and maintain at 85° C.
C. Feed A into B: A is fed into B with a constant feeding rate in 120 minutes.
D. Holding temperature: after feeding A into B, the temperature of the reactor is maintained at 85° C. for additional two hrs, then allow the reactor temp to cool down naturally to room temperature.

The sulfonamide resin from the reactor can be used in a photoresist composition without further purification.

EXAMPLE 5: PHOTORESIST PREPARATION AND PROCESSING

A photoresist composition is prepared by admixing the following materials in the specified amounts:
1. Resin component: Terpolymer of (2-methyl-2-adamantyl methacrylate/beta-hydroxy-gamma-butyrolactone methacrylate/cyano-norbornyl methacrylate in an amount of 6.79 weight % based on total weight of the photoresist composition;
2. Photoacid generator compound: T-butyl phenyl tetramethylene sulfonium perfluorobutanesulfonate in an amount of 0.284 weight % based on total weight of the photoresist composition;
3. Base additive: N-Alkyl Caprolactam in an amount of 0.017 weight % based on total weight of the photoresist composition;
4. Surfactant: R08 (fluorine-containing surfactant, available from Dainippon Ink & Chemicals, Inc.) in an amount of 0.0071 weight % based on total weight of the photoresist composition
5. Substantially non-mixable additive: Polymer of Example 1 prepared as described in Example 1 above and in an amount of 0.213 weight % based on total weight of the photoresist composition.
6. Solvent component: propylene glycol monomethyl ether acetate to provide about a 90 percent fluid composition.

This photoresist composition is spin-coated onto silicon wafers, dried on vacuum hotplate to remove soft-plate and then exposed in an immersion lithography process with aqueous immersion fluid directly contacting the dried photoresist layer. In that immersion system, the photoresist layers is exposed to patterned 193 nm radiation at a dose of about 24.1 mJ/cm$^2$.

The photoresist layers is then post-exposed baked (such as at about 120° C.).

The post-exposed baked photoresist layer is then partially stripped by treatment with a fluid composition containing 20 weight percent propylene glycol methyl ether acetate and 80 weight percent isoamyl ether in single puddle mode for 30 seconds. Such partial stripping modulates (typically, reduces) the water contact angle of the resist layer. After the partial stripping, the photoresist layer is with 0.26N alkaline aqueous developer solution.

EXAMPLE 6: COMPARATIVE

A photoresist was prepared of substantially the formulation described in Example 5 above, but where the substantially non-mixable additive had the following structure:

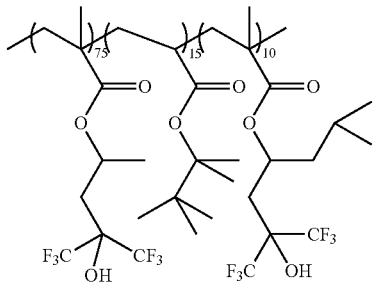

The photoresist was spin coated as described in Example 5 onto two separate sets of wafers.

Both sets of wafers were exposed and post-exposure baked as described in Example 5 above.

The photoresist layers of the first set of wafers was partially stripped by treatment with a fluid composition containing 20 weight percent propylene glycol methyl ether acetate and 80 weight percent isoamyl ether in dynamic mode for 5 seconds. Such partial stripping reduced the water contact angle of the resist layer. After such partial stripping, the photoresist layers of the first set of wafers was developed by treatment with 0.26N alkaline aqueous developer solution to provide a resist relief image.

The photoresist layers of the second wafers were was not treated with a stripper composition and was developed directly after the post-exposure bake by treatment with 0.26N alkaline aqueous developer solution to provide a resist relief image.

The first set of wafers showed significantly less organic residues in substrate areas bared of photoresist by development relative to the amount of organic residues observed in second wafers substrate areas bared of photoresist by development.

What is claimed is:

1. A method for processing a photoresist composition, comprising:
   (a) applying on a substrate a layer of a photoresist composition;
   (b) immersion exposing the photoresist layer to radiation activating for the photoresist composition, wherein the exposed photoresist layer does not have an overcoated barrier layer;
   (c) prior to developing, decreasing the water contact angle of the exposed photoresist layer including treating the exposed photoresist layer with a fluid composition that comprises (i) one or more non-solvents for the photoresist composition and (ii) one or more solvents for the photoresist composition; and
   (d) developing the treated photoresist layer with an aqueous alkaline developer composition to provide a photoresist relief image.

2. The method of claim 1 wherein the photoresist composition comprises:
   (i) one or more resins,
   (ii) a photoactive component, and
   (iii) one or more materials that are substantially non-mixable with the one or more resins.

3. The method of claim 2 wherein the one or more materials are resins.

4. The method of claim 1 wherein the photoresist composition comprises:
   (i) one or more resins,
   (ii) a photoactive component, and
   (iii) one or more materials that comprise 1) Si substitution; 2) fluorine substitution; 3) hyperbranched polymers; and/or 4) polymeric particles.

5. The method of claim 1 wherein prior to developing, the exposed photoresist layer is treated with a fluid composition that comprises isoamyl ether, hexane, cyclohexane, heptane, octane or their isomers or isomer mixtures, or water.

6. The method of claim 5 wherein the fluid composition further comprises ethyl lactate, propylene glycol methyl ether acetate, propylene glycol methyl ether, dipropylene glycol monomethyl ether or tetrahydrofuran.

7. A method for processing a photoresist composition, comprising:
   (a) applying on a substrate a photoresist composition;
   (b) immersion exposing the photoresist layer to radiation activating for the photoresist composition;
   (c) prior to developing, removing a portion of the exposed photoresist layer; and
   (d) developing the treated photoresist layer to provide a photoresist relief image.

8. A method for processing a photoresist composition, comprising:
   (a) applying on a substrate a layer of a photoresist composition;
   (b) exposing the photoresist layer to radiation activating for the photoresist composition wherein the exposed photoresist layer does not have an overcoated barrier layer;
   (c) prior to developing, treating the exposed photoresist composition layer with a solvent composition that comprises (i) one or more non-solvents for the photoresist composition and (ii) one or more solvents for the photoresist composition, wherein the treating removes a portion but not all of the exposed photoresist layer;
   (d) developing the treated photoresist layer to provide a photoresist relief image.

9. The method of claim 8 wherein prior to developing, the exposed photoresist layer is removed with a fluid composition that comprises isoamyl ether, hexane, cyclohexane, heptane, octane or their isomers or isomer mixtures, or water.

10. The method of claim 9 wherein the fluid composition further comprises ethyl lactate, propylene glycol methyl ether acetate, propylene glycol methyl ether, dipropylene glycol monomethyl ether or tetrahydrofuran.

11. The method of claim 8 wherein not more than 50 percent of the exposed photoresist layer thickness is removed prior to development.

12. The method of claim 8 wherein prior to developing, the exposed photoresist layer is treated with a fluid composition that comprises isoamyl.

13. The method of claim 12 wherein the fluid composition further comprises propylene glycol methyl ether acetate.

14. The method of claim 8 wherein the fluid composition further comprises propylene glycol methyl ether acetate.

15. The method of claim 8 wherein the photoresist layer is immersion exposed.

* * * * *